(12) United States Patent
Mei

(10) Patent No.: US 11,337,312 B2
(45) Date of Patent: May 17, 2022

(54) SYSTEMS AND METHODS FOR BONDING ELECTRONIC COMPONENTS ON SUBSTRATES WITH ROUGH SURFACES

(71) Applicant: Palo Alto Research Center Incorporated, Palo Alto, CA (US)

(72) Inventor: Ping Mei, San Jose, CA (US)

(73) Assignee: Palo Alto Research Center Incorporated, Palo Alto, CA (US)

(*) Notice: Subject to any disclaimer, the term of this patent is extended or adjusted under 35 U.S.C. 154(b) by 90 days.

(21) Appl. No.: 17/014,111

(22) Filed: Sep. 8, 2020

(65) Prior Publication Data

US 2022/0078917 A1 Mar. 10, 2022

(51) Int. Cl.

| | |
|---|---|
| *H01L 21/50* | (2006.01) |
| *H05K 3/32* | (2006.01) |
| *H01L 23/00* | (2006.01) |
| *H01L 23/498* | (2006.01) |
| *H01L 21/48* | (2006.01) |
| *H05K 1/18* | (2006.01) |
| *H05K 3/22* | (2006.01) |
| *H05K 1/03* | (2006.01) |

(52) U.S. Cl.
CPC .......... *H05K 3/321* (2013.01); *H01L 21/481* (2013.01); *H01L 23/4985* (2013.01); *H01L 24/32* (2013.01); *H01L 24/83* (2013.01); *H05K 1/189* (2013.01); *H05K 3/22* (2013.01); *H01L 2224/32227* (2013.01); *H01L 2224/83851* (2013.01); *H01L 2224/83862* (2013.01); *H05K 1/038* (2013.01); *H05K 2201/10151* (2013.01); *H05K 2203/0776* (2013.01); *H05K 2203/1105* (2013.01); *H05K 2203/1461* (2013.01)

(58) Field of Classification Search
CPC ... H01L 21/481; H01L 23/4985; H01L 24/32; H01L 24/83; H01L 2224/32227; H01L 2224/83851; H01L 2224/83862
USPC .......................................... 438/119; 257/783
See application file for complete search history.

(56) References Cited

U.S. PATENT DOCUMENTS

| | | | |
|---|---|---|---|
| 7,592,276 B2* | 9/2009 | Hill ...................... | D03D 15/258 442/301 |
| 9,305,807 B2 | 4/2016 | Whiting et al. | |
| 9,927,804 B2 | 3/2018 | Raychaudhuri et al. | |

(Continued)

FOREIGN PATENT DOCUMENTS

| | | |
|---|---|---|
| WO | 2012038849 A1 | 3/2012 |
| WO | 2014135958 A1 | 9/2014 |

*Primary Examiner* — Luan C Thai
(74) *Attorney, Agent, or Firm* — Fox Rothschild LLP

(57) ABSTRACT

Systems and methods for bonding an electronic component to substrate with a rough surface. The method comprising: disposing an insulating adhesive on the substrate; applying heat and pressure to the insulating adhesive to cause the adhesive to flow into at least one opening formed in the substrate; curing the insulating adhesive to form a pad that is at least partially embedded in the substrate and comprises a planar smooth surface that is exposed; disposing at least one trace on the planar smooth surface of the pad; depositing an anisotropic conductive material on the pad so as to at least cover the at least one trace; placing the electronic component on the pad so that an electrical coupling is formed between the electronic component and the at least one trace; and bonding the electronic component to the substrate by curing the anisotropic conductive material.

29 Claims, 13 Drawing Sheets

(56) References Cited

U.S. PATENT DOCUMENTS 10,910,315 B2* 2/2021 Sunshine ................ H01L 33/62
2016/0320037 A1* 11/2016 Wong ..................... H05K 1/038

* cited by examiner

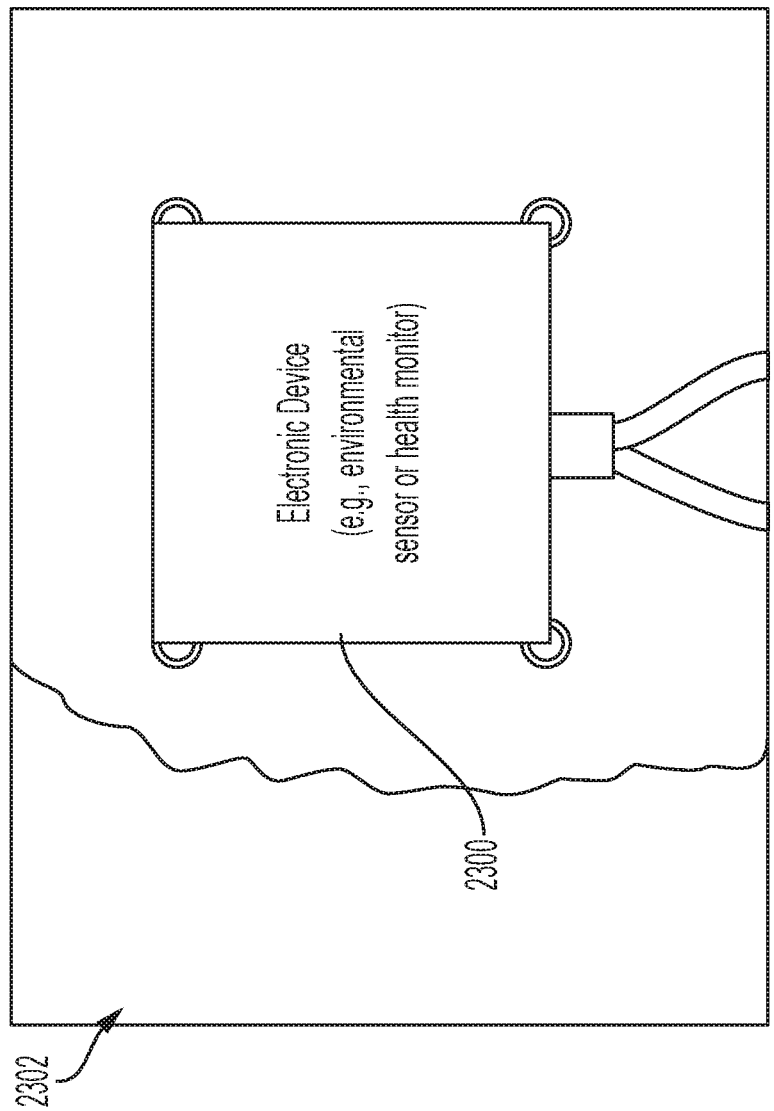

SYSTEMS AND METHODS FOR BONDING ELECTRONIC COMPONENTS ON SUBSTRATES WITH ROUGH SURFACES

BACKGROUND

The present disclosure relates generally to systems and methods for bonding electronic components on substrates with rough surfaces (e.g., textile substrates such as fabric). In the conventional art, chips are coupled to a fabric via a conductive epoxy and wire bonding. A non-conductive adhesive is manually disposed on the fabric. An electronic component is placed on the non-conductive adhesive with the conductive pads facing up so that the conductive pads are accessible. A first end of a wire is then coupled to a trace formed on the fabric via a conductive epoxy. A second opposing end of the wire is coupled to a conductive pad of the chip via the conductive epoxy or wire bonding. The conductive epoxy is manually disposed on the fabric and the chip. The wire connections often fail, and therefore provide an undesirable yield and/or lifespan for fabric electronics. Also, this manual process is relatively costly and time consuming.

SUMMARY

The present disclosure concerns implementing systems and methods for bonding an electronic component (e.g., an integrated circuit) to a substrate with a rough surface (e.g., a textile substrate such as a woven fabric). The methods comprise: disposing an insulating adhesive (e.g., an epoxy) on the substrate; applying heat and pressure to the insulating adhesive to cause the adhesive to flow into at least one opening formed in the substrate; curing the insulating adhesive to form a pad that is at least partially embedded in the substrate and comprises a planar smooth surface that is exposed; disposing at least one trace on the planar smooth surface of the pad; depositing an anisotropic conductive material (e.g., an Anisotropic Conductive Paste (ACP) or an Anisotropic Conductive Film (ACF)) on the pad so as to at least cover the at least one trace; placing the electronic component on the pad so that an electrical coupling is formed between the electronic component and the at least one trace; and bonding the electronic component to the substrate by curing the anisotropic conductive material. The electronic component may be electrical coupled to the at least one trace at the same time the electronic component is bonded to the substrate The pad is a rigid or semi-rigid structure having a size and shape selected so that a flexibility of the substrate is unaffected by the pad. The planar smooth surface of the pad is absent of any openings.

In some scenarios, the electronic component may be formed on a die of semiconducting material. The die is bonded to the substrate via the anisotropic conductive material. Alternatively, the electronic component is formed on a die of semiconducting material that is packaged as a chip. The chip is bonded to the substrate via the anisotropic conductive material.

In those or other scenarios, proper operation of an electronic device comprising the electronic component is validated prior to curing the anisotropic conductive material. The electronic component may be coated with a flexible fluid resistive material subsequent to being bonded to the substrate.

The present document also concerns an electronic device. The electronic device comprises: a substrate with a rough surface (e.g., a textile substrate such as a woven fabric); a pad integrated with the substrate (the pad being formed of a cured insulating adhesive (e.g., an epoxy) that is at least partially embedded in the substrate); at least one trace disposed on a planar smooth surface of the pad; an anisotropic conductive material deposited on the planar smooth surface of the pad so as to at least cover the at least one trace; and an electronic component bonded to the pad via the anisotropic conductive material which has been cured. The anisotropic conductive material facilitates an electrical coupling between the electronic component and the at least one trace.

In some scenarios, the pad is a rigid or semi-rigid structure having a size and shape selected so that a flexibility of the substrate is unaffected by the pad. The planar smooth surface of the pad is absent of any openings.

In those or other scenarios, the electronic component is formed on a die of semiconducting material. The die is bonded to the substrate via the anisotropic conductive material. Alternatively, the electronic component is formed on a die of semiconducting material that is packaged as a chip. The chip is bonded to the substrate via the anisotropic conductive material. Proper operation of the electronic device may be validated prior to when the anisotropic conductive material is cured. The electronic component may be coated with a flexible fluid resistive material (e.g., a rubber or polymeric material).

BRIEF DESCRIPTION OF THE DRAWINGS

The present solution will be described with reference to the following drawing figures, in which like numerals represent like items throughout the figures.

FIG. 23 provides an illustration of an illustrative sensor bonded to a substrate in accordance with the present solution.

DETAILED DESCRIPTION

Figure 1:
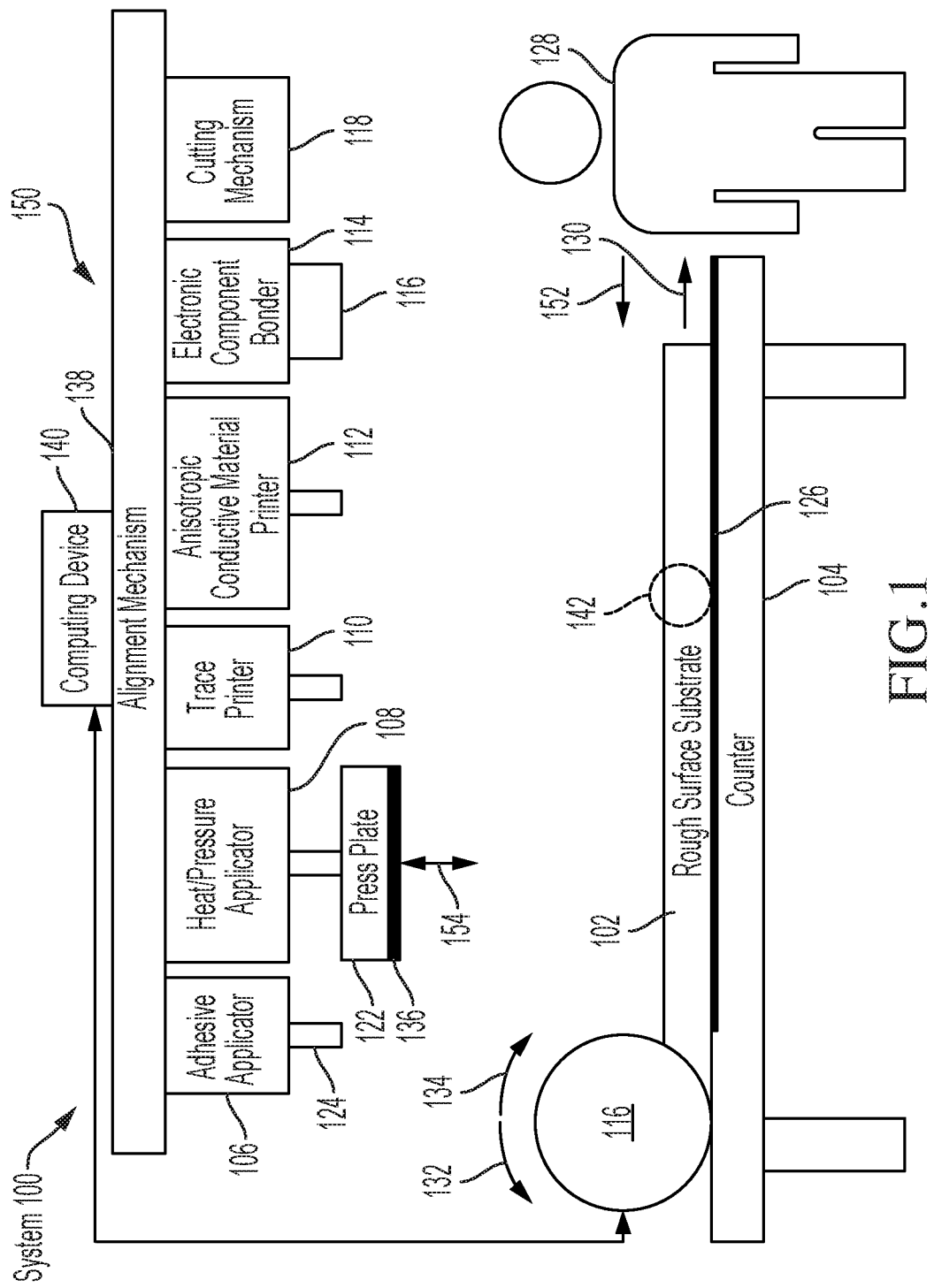
FIG. 1 provides an illustration of an illustrative system for bonding electronic components on substrates with rough surfaces (e.g., textile substrates).

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present solution may be embodied in other specific forms without departing from its spirit or essential characteristics. The described embodiments are to be considered in all respects only as illustrative and not restrictive. The scope of the present solution is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present solution should be or are in any single embodiment of the present solution. Rather, language referring to the features and advantages is understood to mean that a specific feature, advantage, or characteristic described in connection with an embodiment is included in at least one embodiment of the present solution. Thus, discussions of the features and advantages, and similar language, throughout the specification may, but do not necessarily, refer to the same embodiment.

Furthermore, the described features, advantages and characteristics of the present solution may be combined in any suitable manner in one or more embodiments. One skilled in the relevant art will recognize, in light of the description herein, that the present solution can be practiced without one or more of the specific features or advantages of a particular embodiment. In other instances, additional features and advantages may be recognized in certain embodiments that may not be present in all embodiments of the present solution.

Reference throughout this specification to "one embodiment", "an embodiment", or similar language means that a particular feature, structure, or characteristic described in connection with the indicated embodiment is included in at least one embodiment of the present solution. Thus, the phrases "in one embodiment", "in an embodiment", and similar language throughout this specification may, but do not necessarily, all refer to the same embodiment.

As used in this document, the singular form "a", "an", and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to".

One of the challenges in making fabric electronics is bonding an electronic component on a fabric. As discussed above in the background section of this document, a known solution for creating a fabric electronic device is to bond an electronic component (e.g., an integrated circuit) to a piece of fabric using wires and two different types of epoxy. However, it is difficult to scale this known solution to an automatic manufacturing process for fabric electronics. This known approach requires the development of new chip packaging. To solve this problem, the present solution provides systems and methods for manufacturing fabric electronics by mounting a packaged chip or bare die on a substrate in a novel manner.

The present solution generally concerns systems and methods for bonding electronic components on substrates with rough surfaces (e.g., textile substrates such as fabrics). The present solution utilizes adhesive(s) to generate one or more smooth and flat surfaces on a portion of a substrate. Conductive traces are then formed on the substrate and/or smooth/flat surface(s) in accordance with a printing technique. An electronic component (e.g., an integrated circuit in a packaged chip, chiplet or bare die form, a battery, and/or a surface mount passive component such as a resistor or capacitor) is aligned with and mounted on the conductive traces using a bonding process. The term "chiplet", as used herein, refers to a circuit block that is designed to work with other circuit components to form larger more complex circuits. The circuit block can include, but is not limited to, passive electronic components (e.g., resistors and/or capacitors). The bonding process can include, but is not limited to, an ACP bonding process and/or an ACF bonding process.

Illustrative Systems

Figure 4:
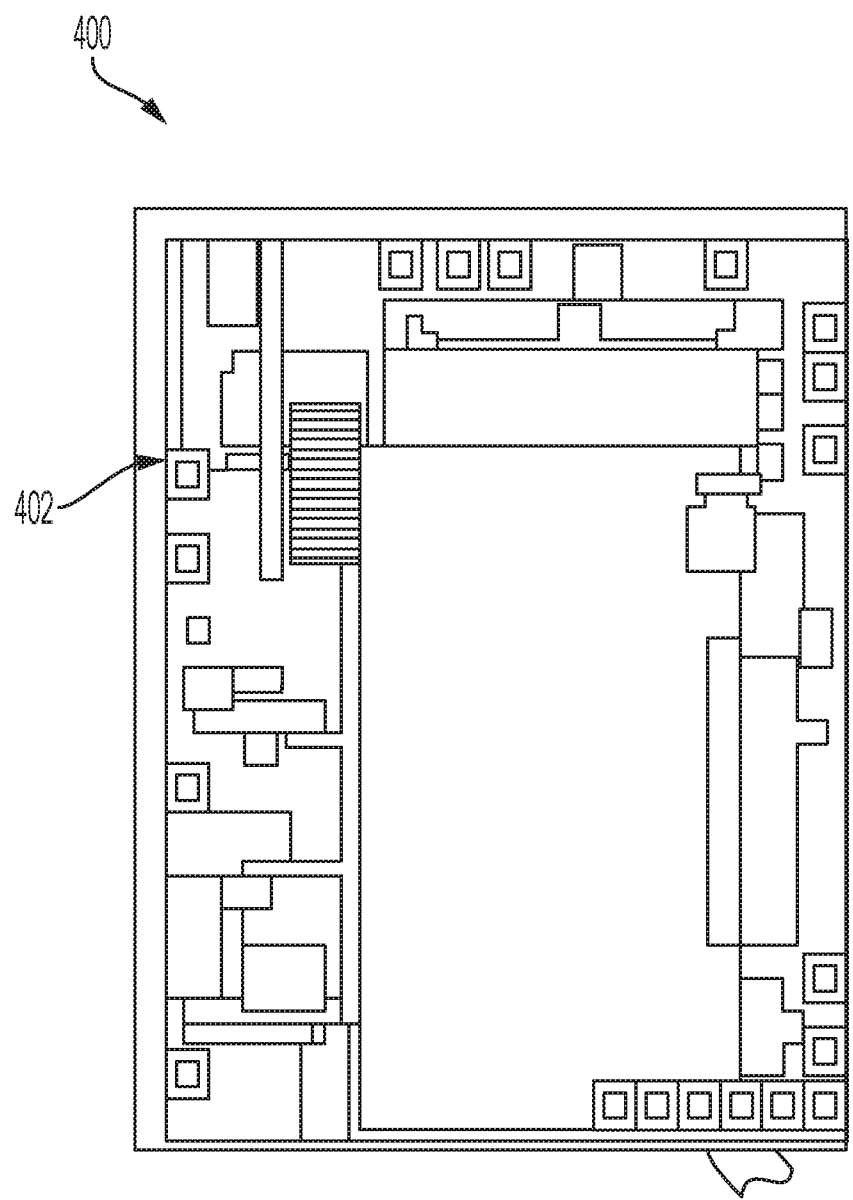
FIG. 4 provides an illustration of an illustrative chip including an integrated circuit.

Referring now to FIG. 1, there is provided a schematic illustration of an illustrative system 100 for bonding electronic component(s) on substrates with rough surfaces (e.g., textile substrates such as fabrics). The electronic component(s) can include, but is(are) not limited to, an IC, a battery, a resistor, a capacitor, an inductor, a diode and/or other active/passive elements. An illustration of an illustrative electronic component 400 is provided in FIG. 4. The electronic component 400 comprises a packaged chip with an integrated circuit. As shown in FIG. 1, system 100 comprises a counter 104 on which a substrate 102 (e.g., a fabric) can be placed or otherwise disposed. The counter 104 may have a conveyer belt 126 or other means disposed thereon for mechanically moving the substrate 102 in direction 130.

A dispensing machine 116 may be provided for the substrate 102. The dispensing machine 116 is configured to receive a reel and/or a spool, and rotate the reel/spool in two opposing directions shown by arrows 132, 134. The rotation is achieved using gear(s) and motor(s). The substrate 102 is wound on the reel/spool. The substrate 102 may be formed of a cotton or synthetic material.

Figure 3:
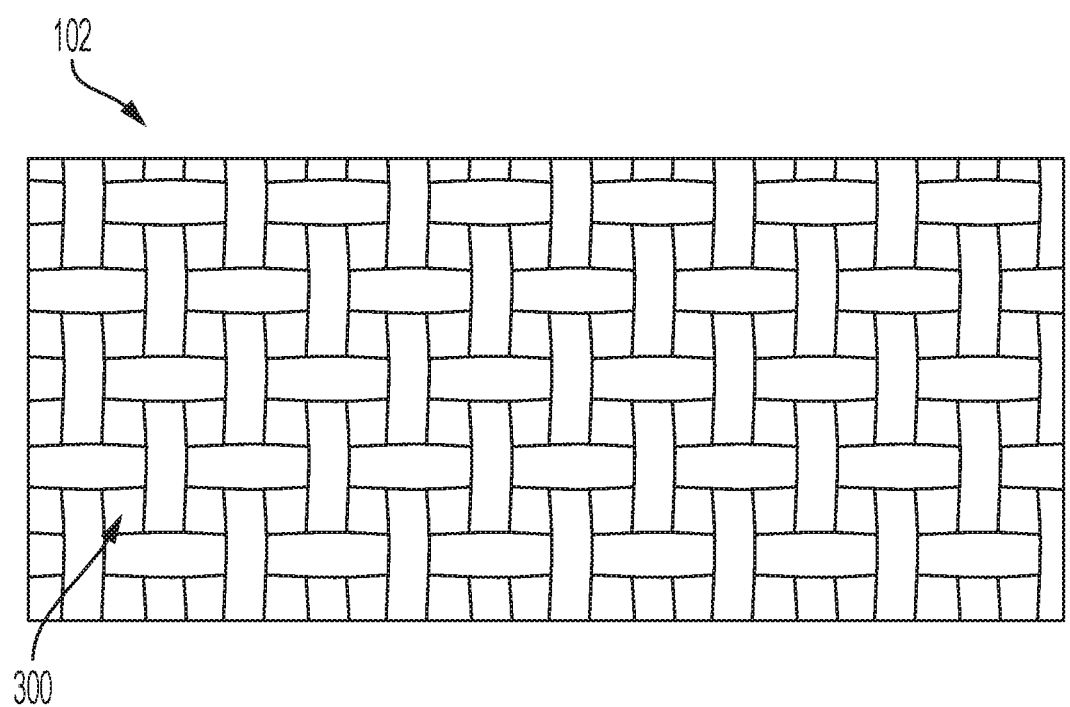
FIG. 3 provides an illustration of an illustrative substrate.

The substrate 102 can include, but is not limited to, a woven fabric as shown in FIG. 3. Notably, the woven fabric comprises a plurality of openings 300 which make (i) forming electrically isolated and high resolution traces on the fabric difficult, and (ii) surface mounting of the electronic component 400 or a die to the fabric difficult. Difficulty (i) exists because each trace formed on the fabric will also have openings aligned with openings 300. Thus, the trace will need to have a relatively large surface area to account for the loss of material caused by the openings. In effect, two adjacent traces overlap each other or otherwise contact each other, whereby electrical isolation therebetween is not provided. Difficulty (ii) exists because each contact pad 402 of the electronic component 400 or die has (a) a size that is the same as or smaller than the size of each opening and/or (b) a spacing with an adjacent contact pad that is the same as the spacing of openings 300. As such, an incomplete electrical connection or no electrical connection may be formed between at least one contact pad and at least one trace when a surface mounting process is employed. The present solution addresses these issues. The manner in which these issues are addressed will become apparent as the discussion progresses.

During a manufacturing process, a computing device 140 controls the dispensing machine 116 to turn the reel/spool by an amount that allows a portion of the substrate 102 to be paid out. The conveyer belt 126 then causes the paid out portion of the substrate 102 to be moved in direction 130 by a certain amount. The conveyer belt 126 may also be controlled by the computing device 140. In some scenarios, the substrate 102 is moved in direction 130 and/or opposing direction 152 so as to align a given portion 142 of the substrate 102 with given components 106, 108, 110, 112, 114, 118 of a manufacturing system 150 at different times during the manufacturing process. In other scenarios, the manufacturing system 150 comprises an alignment mechanism 138 that moves the components 106, 108, 110, 112, 114, 118 relative to the given portion 142 of the substrate 102 during the manufacturing process. The alignment mechanism 138 can include, but is not limited to, motor(s), gear(s), track(s), and/or articulating arm(s). The alignment mechanism 138 is also controlled by the computing device 140. The substrate 102 may have at least one alignment marking that can be used to guide the computing device 140 for properly aligning the component(s) 106, 108, 110, 112, 114, 118 with the given portion 142 thereof. The alignment markings can include, but are not limited to, shape(s) or line(s) printed on the substrate, created by, and/or formed using color die(s).

Next, a pad is integrated and at least partially embedded with the substrate 102. An illustration of an illustrative pad 500 is provided in FIG. 5. The pad 500 has a planar smooth continuous surface 502, and incldues material that fills openings 300 of the given portion 142 of substrate 102. In this regard, an adhesive applicator 106 is aligned with the given portion 142 of substrate 102. The adhesive applicator comprises a nozzle 124 for dispensing and applying an adhesive to the given portion 142 of substrate 102. Nozzles are well known in the art. The adhesive may include, but is not limited to, a 1-part insulating epoxy, or a 2-part insulating epoxy (e.g., having part number 2216 which is available from 3M of the United States). The amount of adhesive disposed on the substrate 102 is selected in accordance with a given application and/or a desired shape/size of the pad.

Heat and pressure are then applied to the adhesive and the given portion 142 of substrate 102 within a given amount of time (e.g., 1-20 minutes). In this regard, a heat/pressure applicator 108 is aligned with the adhesive. Heat/pressure applicators are well known in the art. In some scenarios, the heat/pressure applicator 108 includes a press plate 122 that is movable in two opposing directions shown by arrow 154. The press plate 122 may be coated with a non-stick material or have a non-stick film 136 coupled thereto. The non-stick feature of the press plate 122 ensures that the adhesive will not adhere or otherwise be coupled to the press plate while the heat/pressure is being applied thereto.

Once the press plate 122 is moved in contact with the substrate 102, the adhesive and given portion 142 of substrate are compressed between the press plate 122 and the counter 104 (or conveyor belt 126) for a given amount of time (e.g., 1-3 minutes). A temperature of the press plate is increased (e.g., via conductive wires disposed within the press plate) to a given temperature (e.g., 150-160° C.) prior to, during or after being moved in contact with the substrate 102. The application of heat and pressure causes the adhesive to flow into openings 300 of the given portion 142 of substrate 102, and cure such that a pad 500 is integrated with the substrate. The pad 500 provides a planar smooth exposed continuous surface (without any openings) to which the electronic component (e.g., chip or die) can be mounted on the given portion 142 of substrate. The pad 500 is a rigid or semi-rigid structure. The shape and size of the pad is selected so that the flexibility of the substrate is not or only minimally impacted thereby. The pad can have any shape such as a circular shape, an elliptical shape, a square shape, or a rectangular shape.

Figure 5:
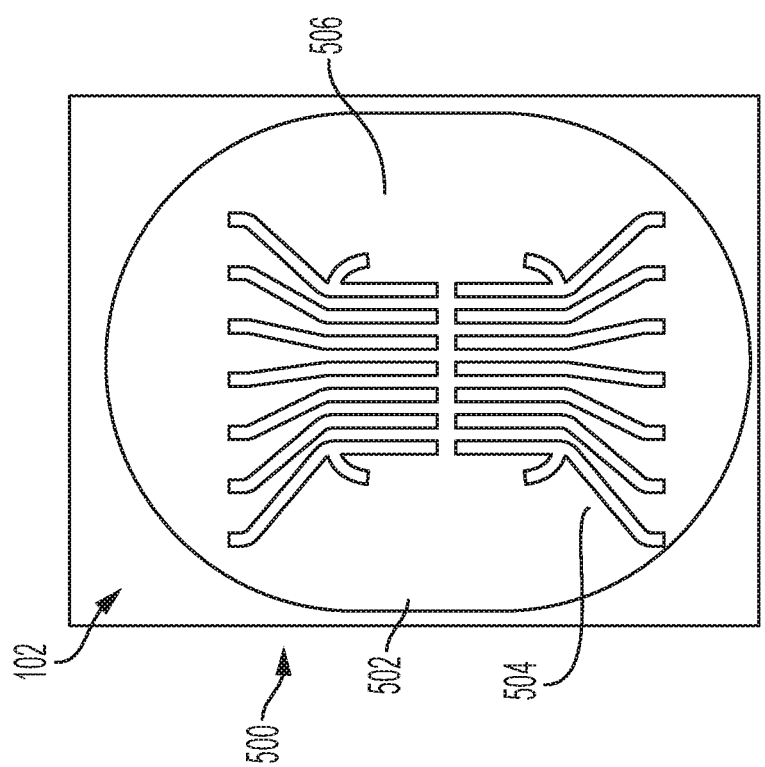
FIG. 5 provides an illustration of illustrative traces formed in a pad integrated with and at least partially embedded in a substrate.
Figure 6:
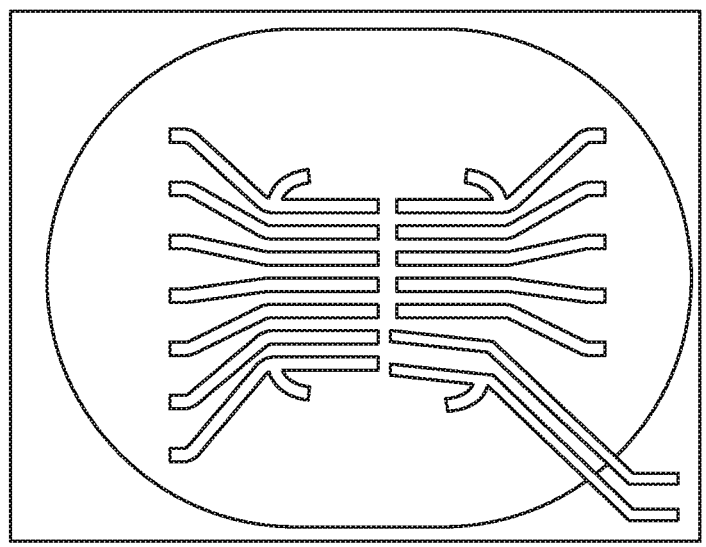
FIG. 6 provides an illustration of other illustrative traces formed in a pad integrated with and at least partially embedded in a substrate.
Figure 8:
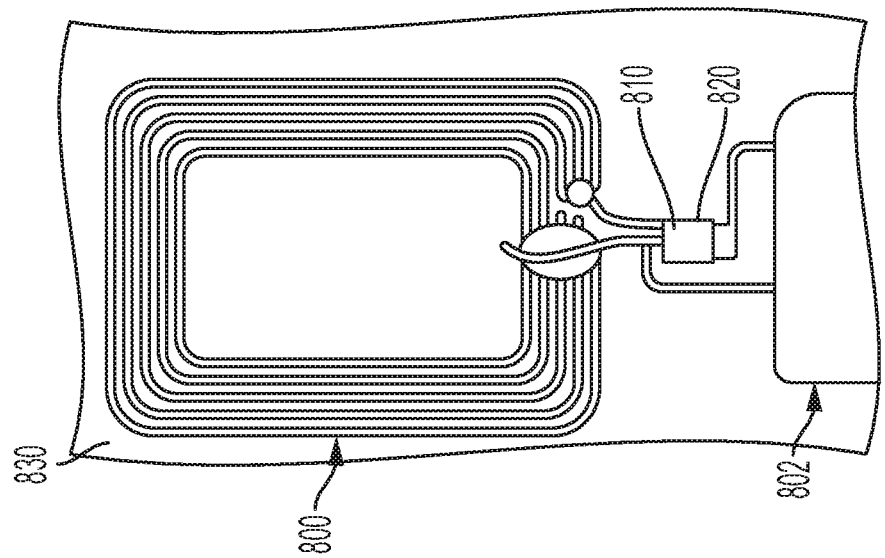
FIG. 8 provides an illustration of another illustrative electronic device (e.g., a communication device and power source) integrated with a substrate.
Figure 7:
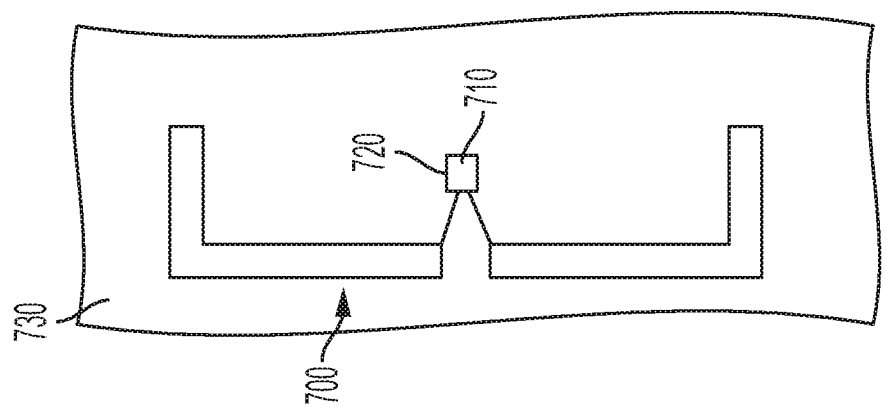
FIG. 7 provides an illustration of an illustrative electronic device (e.g., Radio Frequency (RF) tag) integrated with a substrate.

After pad formation, a trace printer 110 is used to dispose one or more conductive traces on the substrate 102. Trace printers are well known in the art. In some scenarios, the trace printer comprises an ink jet printer configured to dispense conductive ink, whereby traces are printed or otherwise deposited on objects (e.g., substrate 102). An illustration of conductive traces 504 disposed on the substrate is provided in FIG. 5. In FIG. 5, the conductive traces 504 are shown as being disposed only on the pad 500. The present solution is not limited in this regard. The conductive traces can be disposed on the pad and/or other areas of the substrate where the pad does not exist as shown in FIG. 6. The conductive traces can have any geometry selected in accordance with a given application. For example, as shown in FIGS. 7-8, an electronic device (e.g., a Radio Frequency Identification (RFID) device) may comprise conductive traces forming an antenna structure 700, 800 (e.g., dipole or coil) directly on fabric 730, 830. The conductive traces continue to the pad 710, 810 to connect to a processor 720, 820. Conductive traces may additionally or alternatively be provides to form an electrical connector between an electronic component (e.g., chip/die) and a power source 802.

The printer 110 may also form at least one alignment marking 506 on the pad 500 that can be subsequently used to guide proper placement of the electronic component (e.g., chip/die) on the pad. The alignment markings can include, but are not limited to, shape(s) or line(s) printed on the pad or substrate (e.g., in a color different than the pad's color or substrate's color), created by stitching (e.g., using thread in a color different than the pad's color or substrate's color), and/or formed using die(s) (e.g., a die with a color different than the pad's color or substrate's color).

Thereafter, the electronic component 400 is bonded to the pad 500. In this regard, an anisotropic conductive material printer 112 is aligned with the pad 500. Printer 112 is configured to print or otherwise deposit an anisotropic conductive material on the conductive trace(s) and/or pad. Such printers are well known in the art. In some scenarios, the printer 112 comprises an ink jet printer or an extrusion printer. The anisotropic conductive material can include, but is not limited to, an Anisotropic Conductive Paste (ACP) material or an Anisotropic Conductive Film (ACF) material. ACP and ACF materials are well known in the art. In some scenarios, the ACP and ACF materials include a thermosetting resin containing massive graphite particles, gold particles and gold plated plastic particles. The anisotropic conductive material has the following dual purposes: create a vertical electrical connection between a trace and a conductive member (e.g., a pad) of the electronic component (e.g., chip/die); and securely bond the electronic component to the pad.

Once the anisotropic conductive material has been applied to the conductive traces printed on the substrate, an electronic component bonder 114 is aligned with the given portion 142 of substrate 102. The electronic component bonder 114 comprises a mechanical means (e.g., an articulating arm) for aligning the electronic component with the trace(s) and/or placing the electronic component on the pad. The electronic component is strategically placed on the pad so that an electrical coupling or connection is formed between the trace(s) and the electronic component. Heat and/or pressure is then applied by the heat/pressure applicator 108 for forming the conductive path between the traces and the electronic component and causing the anisotropic conductive material to cure. In effect, the electronic component is bonded to the substrate.

In some scenarios, proper operation of the electronic device may optionally be validated prior to the application of heat/pressure for curing the anisotropic conductive material. The validation can be achieved using an RFID tag reader and/or transmitter of the computing device 140. If the electronic device is operating properly, then the Anisotropic conductive material is cured. In contrast, if the electronic device is not operating properly, then the electronic component (e.g., chip/die) is removed from the pad, and a new electronic component is placed on the pad.

In those or other scenarios, the electronic device may be coated using a flexible fluid resistive material. The flexible fluid resistive material can have a color that matches a color of the substrate 102. The applicator 106, printer 110 and/or printer 112 can be used to apply the coating of flexible fluid resistive material to the substrate 102.

The substrate 102 may then be cut by a cutting mechanism 118 so that a system is formed with one or more integrated electronic devices (e.g., RFID tag). The system can include, but is not limited to, a medical patch with a sensor and a wireless communication device, a smart filter with a sensor, a bed sheet with a sensor, a seat cover with a sensor, a foldable tent with an antenna and solar converter, and a wearable item (e.g., a shirt). The cutting mechanism 118 can include, but is not limited to, a razor and/or scissors. Razors and scissors are well known in the art, and therefore will not be described herein.

Figure 2:
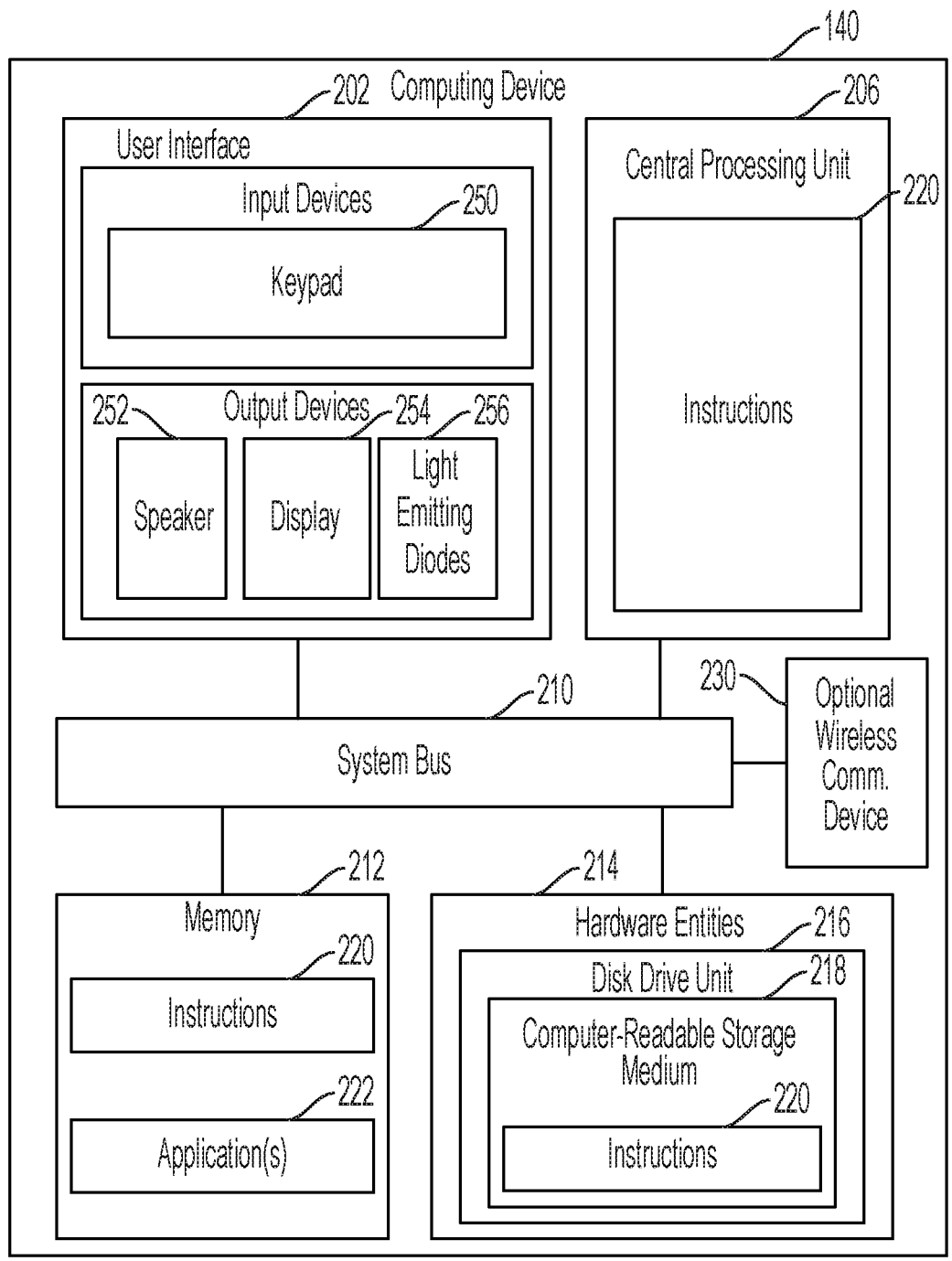
FIG. 2 provides an illustration of an illustrative architecture for the computing device shown in FIG. 1.

Referring now to FIG. 2, there is provided a detailed block diagram of an illustrative architecture for computing device 140. Computing device 140 may include more or less components than those shown in FIG. 2. However, the components shown are sufficient to disclose an illustrative embodiment implementing the present solution. The hardware architecture of FIG. 2 represents one embodiment of a representative computing device configured to facilitate fabrication of substrate based electronic devices As such, the computing device 140 of FIG. 2 implements at least a portion of a method for electronic component (e.g., chip) bonding on substrates in accordance with the present solution.

Some or all the components of the computing device 140 can be implemented as hardware, software and/or a combination of hardware and software. The hardware includes, but is not limited to, one or more electronic circuits. The electronic circuits can include, but are not limited to, passive components (e.g., resistors and capacitors) and/or active components (e.g., amplifiers and/or microprocessors). The passive and/or active components can be adapted to, arranged to and/or programmed to perform one or more of the methodologies, procedures, or functions described herein.

As shown in FIG. 2, the computing device 140 comprises a user interface 202, a CPU 206, a system bus 210, a memory 212 connected to and accessible by other portions of computing device 140 through system bus 210, and hardware entities 214 connected to system bus 210. The user interface can include input devices (e.g., a keypad 250) and output devices (e.g., speaker 252, a display 254, and/or light emitting diodes 256), which facilitate user-software interactions for controlling operations of the computing device 140.

At least some of the hardware entities 214 perform actions involving access to and use of memory 212, which can be a RAM, a disk drive and/or a Compact Disc Read Only Memory ("CD-ROM"). Hardware entities 214 can include a disk drive unit 216 comprising a computer-readable storage medium 218 on which is stored one or more sets of instructions 220 (e.g., software code) configured to implement one or more of the methodologies, procedures, or functions described herein. The instructions 220 can also reside, completely or at least partially, within the memory 212 and/or within the CPU 206 during execution thereof by the computing device 140. The memory 212 and the CPU 206 also can constitute machine-readable media. The term "machine-readable media", as used here, refers to a single medium or multiple media (e.g., a centralized or distributed database, and/or associated caches and servers) that store the one or more sets of instructions 220. The term "machine-readable media", as used here, also refers to any medium that is capable of storing, encoding or carrying a set of instructions 220 for execution by the computing device 140 and that cause the computing device 140 to perform any one or more of the methodologies of the present disclosure.

In some scenarios, the hardware entities 214 include an electronic circuit (e.g., a processor) programmed for facilitating electronic component (e.g., chip) bonding on substrates. In this regard, it should be understood that the electronic circuit can access and run a software application 222 installed on the computing device 140. The software application 222 is generally operative to facilitate control of the adhesive applicator 106, the heat/pressure applicator 108, the trace printer 110, the anisotropic conductive material printer 112, the electronic component bonder 114, and/or the cutting mechanism 118. Other functions of the software application 2522 will become apparent as the discussion progresses. Such other functions can relate to the validation of proper operations by an electronic device during a manufacturing. The validation can be achieved using the optional wireless communication device 230. The wireless communication device 230 can include, but is not limited to, an RFID tag reader and/or transmitter.

Illustrative Methods

Figure 9:
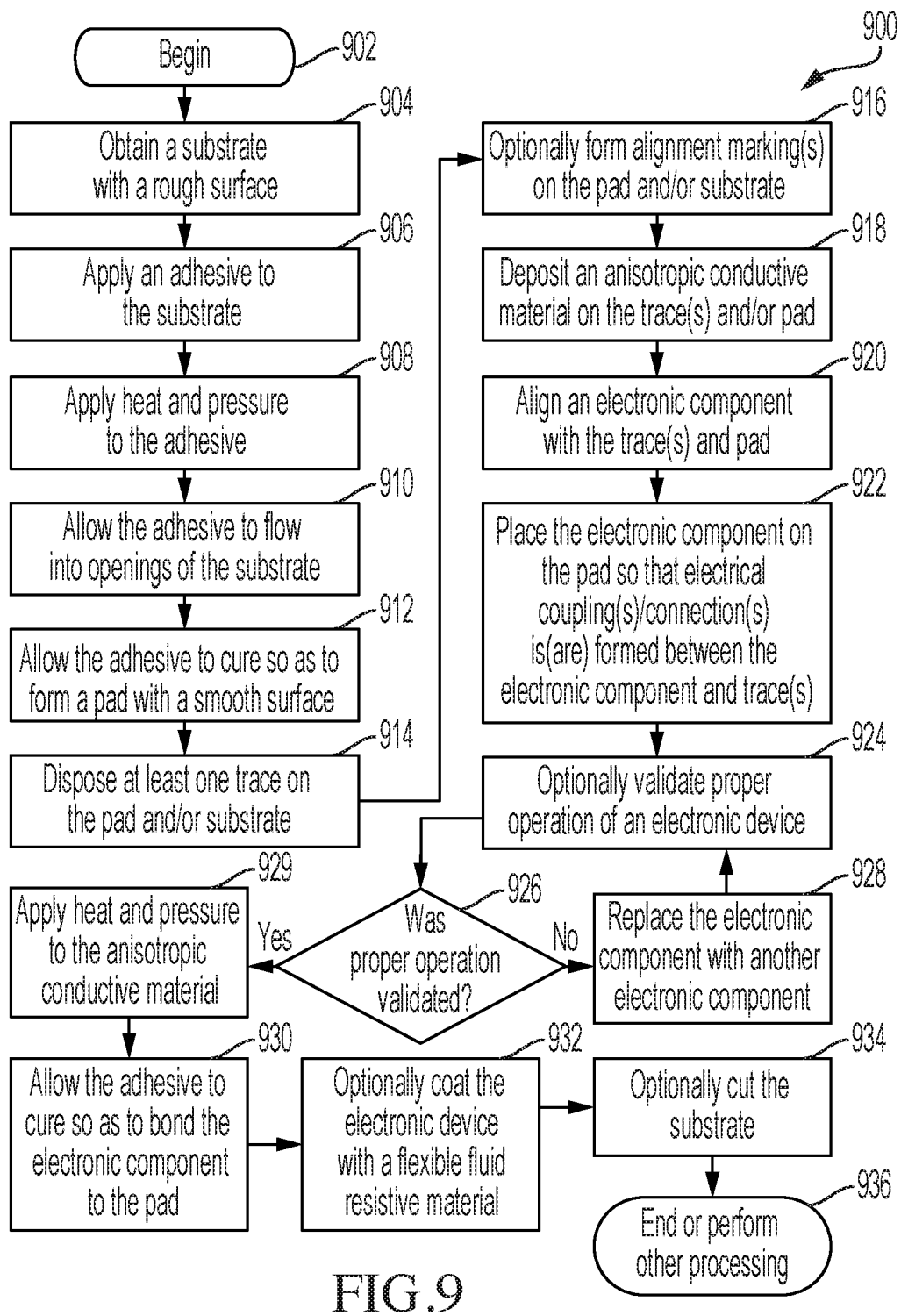
FIG. 9 provides a flow diagram of an illustrative for bonding an electronic component (e.g., in a packaged chip or die form) to a substrate with rough surface(s) and/or incorporating an electronic device in a substrate of an item (e.g., a piece of clothing).
Figure 10:
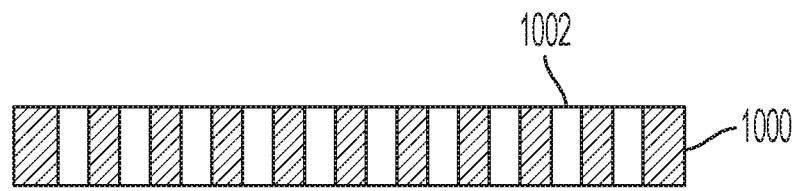
FIGS. 10-18 provide illustrations that are useful for understanding how a substrate based electronic device is fabricated.

Referring now to FIG. 9, there is provided a flow diagram of an illustrative method 900 for bonding an electronic component (e.g., in a packaged die form) to a substrate with rough surface(s) and/or incorporating an electronic device in a substrate of an item (e.g., a piece of clothing). Method 900 begins with 902 and continues with 904 where a substrate with a rough surface (e.g., substrate 102 of FIG. 1) is obtained. In some scenarios, the substrate is paid out from a reel/spool (e.g., by dispensing machine 116 of FIG. 1), and placed on a counter (e.g., counter 104 of FIG. 1). A cross-sectional view of an illustrative substrate 1000 obtained in 904 is provided in FIG. 10. As shown in FIG. 10, the substrate 1000 includes a plurality of openings 1002.

Figure 11:
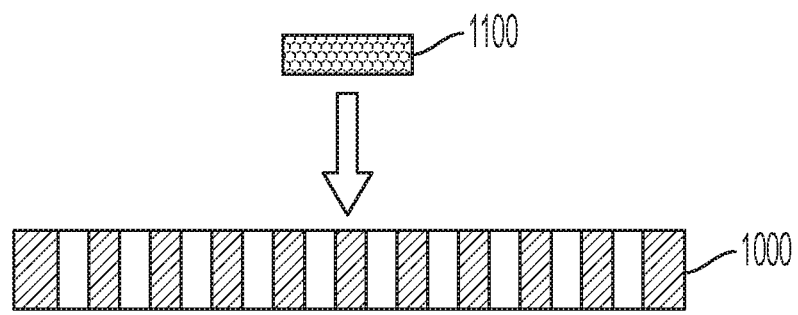

Next, a pad (e.g., pad 500 of FIG. 5) is integrated and at least partially embedded in the substrate so as to provide a smooth surface on the substrate to which an electronic component (e.g., electronic component 400 of FIG. 4) can be mounted. Accordingly, method 900 involves operations 906-912 for this purpose. In 906, an adhesive is applied to or disposed on the substrate. In some scenarios, 906 comprises: aligning an adhesive applicator (e.g., adhesive applicator 106 of FIG. 1) with a given portion (e.g., portion 142 of FIG. 1) of the substrate (e.g., substrate 102 of FIG. 1); and dispensing an adhesive from a nozzle (e.g., nozzle 124 of FIG. 1). An illustration showing an adhesive 1100 being disposed on the substrate 1000 is provided in FIG. 11. The adhesive can include, but is not limited to, an insulating adhesive such as a 1-part insulating epoxy (e.g., having a part number 3621 available from Henkel Loctite of Germany) or a 2-part insulating epoxy (e.g., having part number 2216 which is available from 3M of the United States). The amount of adhesive disposed on the substrate 1000 is selected in accordance with a given application and/or a desired shape/size of the pad.

Figure 12:
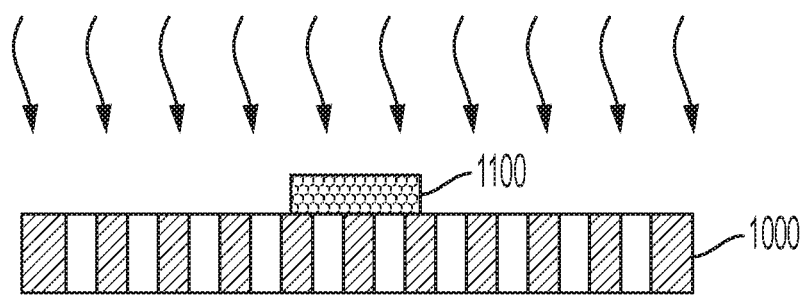
Figure 13:
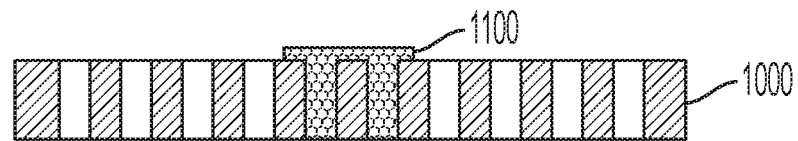

Heat and pressure are applied to the adhesive in 908 (e.g., via the heat/pressure applicator 108 of FIG. 1) for a given amount of time (e.g. 1-20 minutes). An illustration showing heat and pressure being applied to the adhesive 1100 is provided in FIG. 12. In 910, the adhesive is allowed to flow into openings of the substrate. An illustration showing the adhesive 1100 in openings 1002 of the substrate 1000 is provided in FIG. 13. The adhesive is then allowed to cure in 912. The cured adhesive provides the pad with a planar smooth continuous surface (e.g., surface 502 of FIG. 5). The pad is integrated with and at least partially embedded in the substrate. The pad is also a rigid or semi-rigid structure with a shape/size that does not impact or minimally impacts the substrate's flexibility.

Figure 14:
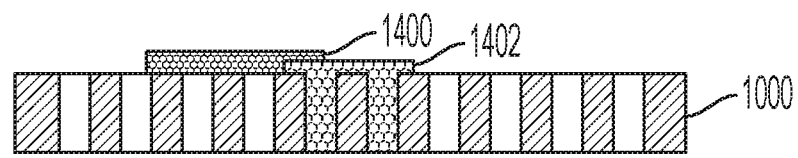

After pad formation, traces are disposed on the pad and/or substrate, as shown by 914. Techniques for disposing traces on objects are well known in the art. Any known or to be known technique for disposing traces on objects can be used herein. In some scenarios, a trace printer (e.g., trace printer 110 of FIG. 1) is used to print a conductive ink (e.g., a silver ink) on the substrate. The trace printer may include, but is not limited to, an ink jet printer. An illustration showing a trace 1400 disposed on the pad 1402 and substrate 1000 is provided in FIG. 14.

In 916, alignment marking(s) is(are) optionally formed on the pad and/or substrate (e.g., also using the printer 110 of FIG. 1). The alignment marking(s) may be provided to facilitate proper placement of an electronic component on the pad and/or substrate in a subsequent operation. The alignment marking(s) can include, but are not limited to, shape(s) or line(s) printed on the pad or substrate (e.g., in a color different than the pad's color or substrate's color), created by stitching (e.g., using thread in a color different than the pad's color or substrate's color), and/or formed using die(s) (e.g., a die with a color different than the pad's color or substrate's color). Component alignment can be also facilitated with an infrared (IR) camera to obtain images of contact pads and traces through the backside of the component (i.e., the side that is opposite to the connection side).

Figure 15:
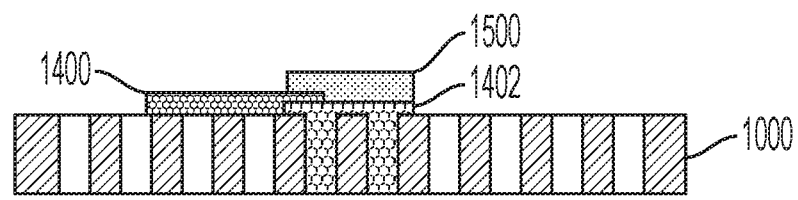
Figure 16:
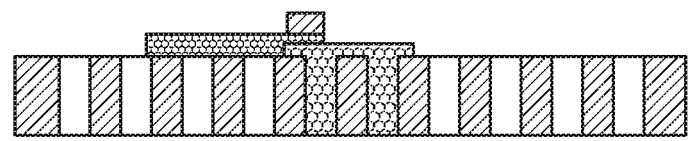

Next, an electronic component is bonded to the pad in accordance with an ACP or ACF bonding technique. ACP and ACF bonding techniques are well known. Any known or to be known ACP or ACF bonding technique can be used here. Accordingly, method 900 continues with 918-930. In 918, an anisotropic conductive material is deposited or otherwise disposed on the trace(s) and/or pad. For example, an anisotropic conductive material printer (e.g., printer 112 of FIG. 1) is used to print an ACP or place an ACF on the conductive trace(s) and/or pad. The anisotropic conductive material printer can include, but is not limited to, an ink jet printer or an extrusion printer. The anisotropic conductive material has the following purposes: create a vertical electrical connection between the trace and a conductive pad (e.g., conductive pad 402 of FIG. 4) of the electronic component; and securely bond the electronic component to the pad. An illustration showing an anisotropic conductive material 1500 disposed on the pad 1402 is provided in FIG. 15. In FIG. 15, the anisotropic conductive material 1500 covers the entire pad 1402. The present solution is not limited in this regard. The anisotropic conductive material may cover only a portion of the pad on which the trace resides as shown in FIG. 16.

Figure 17:
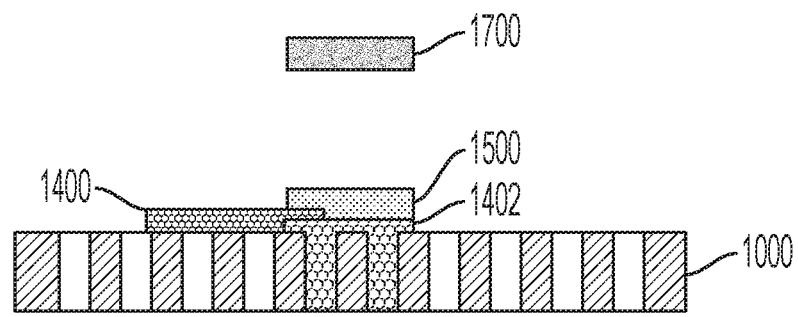
Figure 18:
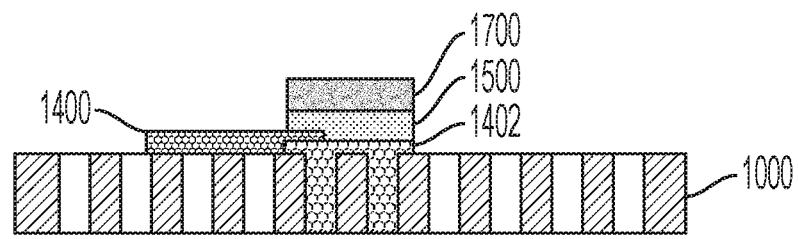

In 920, an electronic component is aligned with the trace(s) and pad. An illustration showing an electronic component 1700 aligned with the trace 1400 and pad 1402 is provided in FIG. 17. Once this alignment is achieved, the electronic component is lowered and placed on the pad and/or anisotropic conductive material so that an electrical coupling/connection is formed between the electronic component and the trace. An illustration showing the electronic component 1700 residing on the anisotropic conductive material is provided in FIG. 18.

Figure 19:
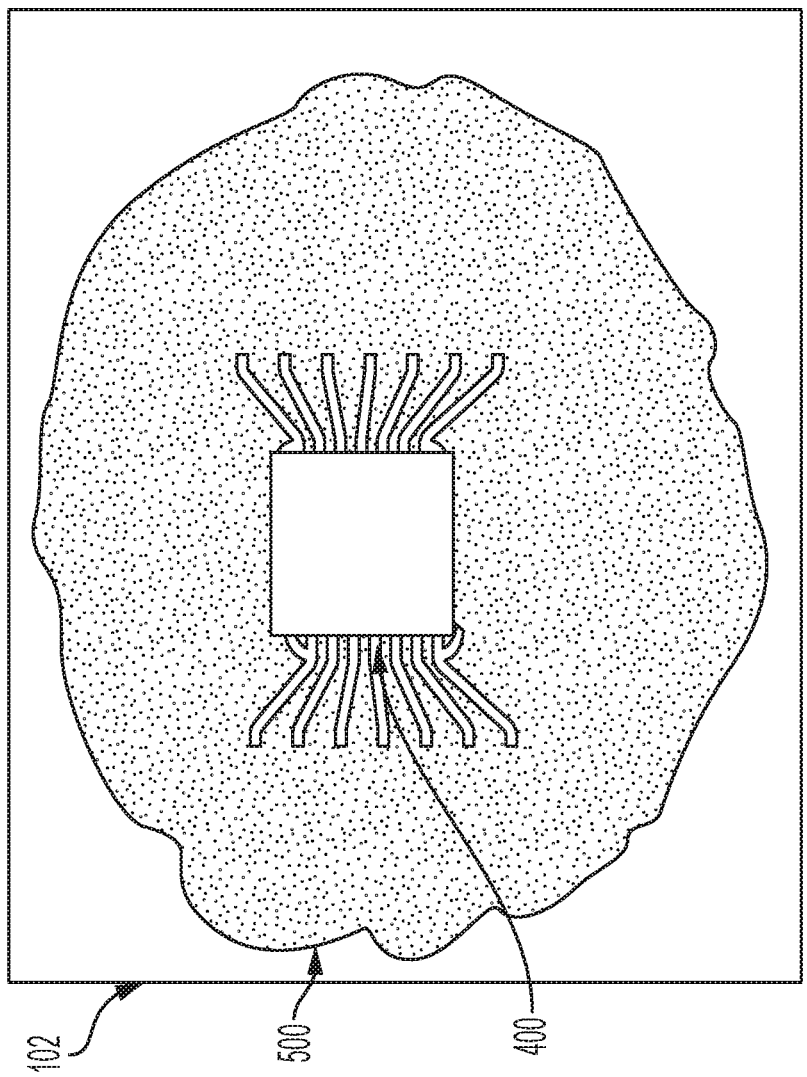
FIG. 19 provides an illustration of an illustrative substrate based electronic device including an electronic component and traces disposed on and coupled to a pad formed on a substrate with rough surface(s).
Figure 20:
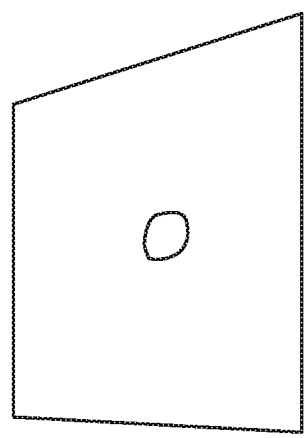
FIG. 20 provides an illustration of an illustrative pad formed on a substrate.
Figure 22:
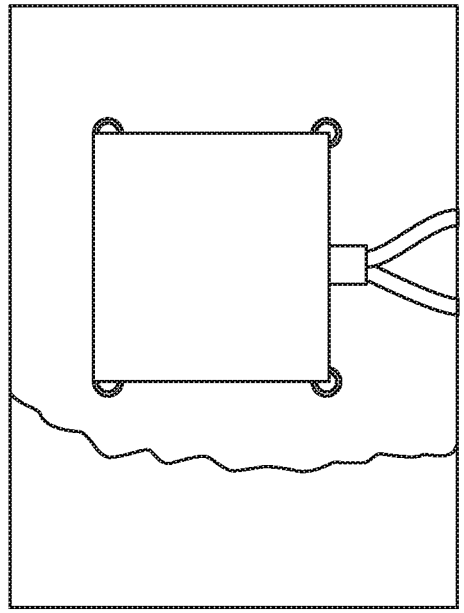
FIG. 22 provides an illustration of an illustrative electronic component bonded to the substrate shown in FIGS. 20-21 such that electrical couplings exist between the traces and conductive pads of the electronic component.
Figure 21:
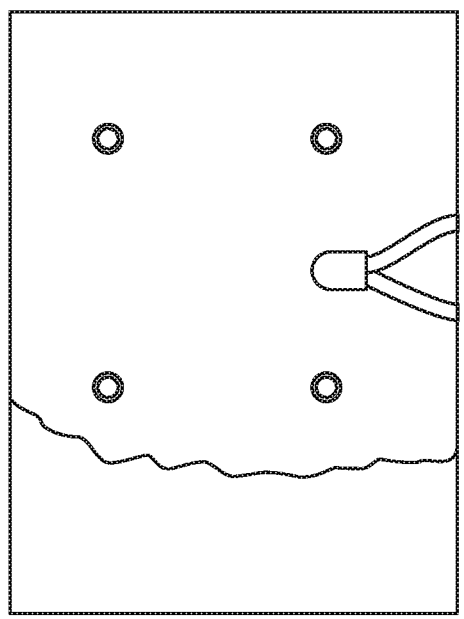
FIG. 21 provides an illustration of illustrative traces formed on a substrate.

In some scenarios, proper operation of an electronic device comprising the electronic component and trace(s) is optionally validated in 924. The validation can be achieved using an RFID tag reader and/or transmitter of a computing device (e.g., computing device 140 of FIG. 1). If the electronic device is not operating properly [926:NO], the electronic component is replaced with another electronic component as shown by 928. Method 900 then returns to 924. In contrast, if the electronic device is operating properly [926:YES], then heat and pressure are applied to the anisotropic conductive material in 929 such that it cures in 930. The electronic component is bonded to the pad and substrate when the anisotropic conductive material is cured. An illustration showing the illustrative an electronic component 400 bonded to the pad 500 is provided in FIG. 19.

The electronic device may optionally be coated with a flexible fluid resistive material (e.g., a rubber or polymeric material) in 932. In 934, the substrate is optionally cut (e.g., by cutting mechanism 118 of FIG. 1) (e.g., to produce a textile substrate item such as a shirt or sheet with an integrated electronic device). Subsequently, 926 is performed where method 900 ends or other processing is performed.

Referring now to FIG. 23, there is provided an illustration showing an illustrative electronic device fabricated in accordance with the present solution. The electronic device can include, but is not limited to, an environmental sensor or a health monitor. In both scenarios, the electronic device comprises a capacitor or resistor. For example, if the electronic device comprises a temperature sensor, then the electronic device senses a temperature through a measured resistance of a resistor. If the electronic device comprises a humidity sensor, then the electronic device senses a level of humidity through a measured capacitance of a capacitor. The resistor and/or capacitor can be in a chiplet form. The chiplet may be coupled to a chip including a wireless communication device (e.g., an RF transceiver) so that the measurement values can be communicated to remote devices (e.g., a smart phone, a smart watch, or a personal computer). The present solution is not limited to the particulars of this example. The electronic device is disposed on a textile substrate 2302 such as a piece of clothing. The piece of clothing and electronic device provide a textile product (e.g., a shirt with an environmental sensor or a health monitor).

Although the present solution has been illustrated and described with respect to one or more implementations, equivalent alterations and modifications will occur to others skilled in the art upon the reading and understanding of this specification and the annexed drawings. In addition, while a particular feature of the present solution may have been disclosed with respect to only one of several implementations, such feature may be combined with one or more other features of the other implementations as may be desired and advantageous for any given or particular application. Thus, the breadth and scope of the present solution should not be limited by any of the above described embodiments. Rather, the scope of the present solution should be defined in accordance with the following claims and their equivalents.

What is claimed is:

1. A method for bonding an electronic component to a substrate with a rough surface, comprising:
    disposing an insulating adhesive on the substrate;
    applying heat and pressure to the insulating adhesive to cause the adhesive to flow into at least one opening formed in the substrate;
    curing the insulating adhesive to form a pad that is at least partially embedded in the substrate and comprises a planar smooth surface that is exposed;
    disposing at least one trace on the planar smooth surface of the pad;
    depositing an anisotropic conductive material on the pad so as to at least cover the at least one trace;
    placing the electronic component on the pad so that an electrical coupling is formed between the electronic component and the at least one trace; and
    bonding the electronic component to the substrate by curing the anisotropic conductive material.

2. The method according to claim 1, wherein the substrate comprises a textile substrate.

3. The method according to claim 2, wherein the textile substrate comprises a woven fabric comprising the at least one opening.

4. The method according to claim 1, wherein the insulating adhesive comprises an epoxy.

5. The method according to claim 1, wherein the pad is a rigid or semi-rigid structure having a size and shape selected so that a flexibility of the substrate is unaffected by the pad.

6. The method according to claim 1, wherein the planar smooth surface of the pad is absent of any openings.

7. The method according to claim 1, wherein the electronic component is formed on a die of semiconducting material, and the die is bonded to the substrate via the anisotropic conductive material.

8. The method according to claim 1, wherein the electronic component is formed on a die of semiconducting material that is packaged as a chip, and the chip is bonded to the substrate via the anisotropic conductive material.

9. The method according to claim 1, wherein the anisotropic conductive material comprises an Anisotropic Conductive Paste (ACP) or an Anisotropic Conductive Film (ACF).

10. The method according to claim 1, further comprising validating proper operation of an electronic device comprising the electronic component prior to curing the anisotropic conductive material.

11. The method according to claim 1, further comprising coating the electronic component with a flexible fluid resistive material subsequent to being bonded to the substrate.

12. The method according to claim 1, wherein the electronic component is electrical coupled to the at least one trace at the same time the electronic component is bonded to the substrate.

13. An electronic device, comprising:
    a substrate with a rough surface;
    a pad integrated with the substrate, the pad being formed of a cured insulating adhesive that is at least partially embedded in the substrate;
    at least one trace disposed on a planar smooth surface of the pad;
    an anisotropic conductive material deposited on the planar smooth surface of the pad so as to at least cover the at least one trace; and
    an electronic component bonded to the pad via the anisotropic conductive material which has been cured;
    wherein the anisotropic conductive material facilitates an electrical coupling between the electronic component and the at least one trace.

14. The electronic device according to claim 13, wherein the substrate comprises a woven fabric comprising at least one opening.

15. The electronic device according to claim 13, wherein the insulating adhesive comprises an epoxy.

16. The electronic device according to claim 13, wherein the pad is a rigid or semi-rigid structure having a size and shape selected so that a flexibility of the substrate is unaffected by the pad.

17. The electronic device according to claim 13, wherein the planar smooth surface of the pad is absent of any openings.

18. The electronic device according to claim 13, wherein the electronic component is formed on a die of semiconducting material, and the die is bonded to the substrate via the anisotropic conductive material.

19. The electronic device according to claim 13, wherein the electronic component is formed on a die of semiconducting material that is packaged as a chip, and the chip is bonded to the substrate via the anisotropic conductive material.

20. The electronic device according to claim 13, wherein the anisotropic conductive material comprises an Anisotropic Conductive Paste (ACP) or an Anisotropic Conductive Film (ACF).

21. The electronic device according to claim 13, wherein proper operation of the electronic device is validated prior to when the anisotropic conductive material is cured.

22. The electronic device according to claim 13, further comprising a flexible fluid resistive material coating the electronic component.

23. The electronic device according to claim 13, wherein the electronic device comprises an environmental sensor or a health monitor.

24. A textile product, comprising:
    a piece of fabric;
    a pad integrated with the piece of fabric, the pad being formed of a cured insulating adhesive that is at least partially embedded in the piece of fabric;
    at least one trace disposed on a planar smooth surface of the pad;
    an anisotropic conductive material deposited on the planar smooth surface of the pad so as to at least cover the at least one trace; and an environmental sensor or health monitor bonded to the pad via the anisotropic conductive material which has been cured.

25. The textile product according to claim 24, wherein the insulating adhesive comprises an epoxy.

26. The textile product according to claim 24, wherein the pad is a rigid or semi-rigid structure having a size and shape selected so that a flexibility of the fabric is unaffected by the pad.

27. The textile product according to claim 24, wherein the fabric comprises a woven fabric with a plurality of openings.

28. The textile product according to claim 27, wherein the planar smooth surface of the pad is absent of any openings.

29. The textile product according to claim 24, wherein the anisotropic conductive material comprises an Anisotropic Conductive Paste (ACP) or an Anisotropic Conductive Film (ACF).

* * * * *